United States Patent [19]

Krieg

[11] Patent Number: 5,739,688
[45] Date of Patent: Apr. 14, 1998

[54] MAGNETIC RESONANCE IMAGING METHOD AND APPARATUS EMPLOYING A STATIC MAGNETIC FIELD HAVING A PREDETERMINED INHOMOGENEITY IN ONE SPATIAL DIRECTION

[75] Inventor: Robert Krieg, Nuernberg, Germany

[73] Assignee: Siemens Aktiengesellschaft, Munich, Germany

[21] Appl. No.: 617,639

[22] Filed: Mar. 19, 1996

[30] Foreign Application Priority Data

Mar. 30, 1995 [DE] Germany .................. 195 11 835.9

[51] Int. Cl.⁶ .......................... G01R 33/34; G01N 24/08
[52] U.S. Cl. .................................. 324/309; 324/307
[58] Field of Search .............................. 324/300, 306, 324/307, 309, 318; 128/653.2, 653.3

[56] References Cited

U.S. PATENT DOCUMENTS

| | | | |
|---|---|---|---|
| 5,126,674 | 6/1992 | Miller et al. | 324/309 |
| 5,200,701 | 4/1993 | Siebold et al. | |
| 5,235,279 | 8/1993 | Kaufman et al. | |

FOREIGN PATENT DOCUMENTS 0 511 872  4/1992  European Pat. Off. .
0 526 983  7/1992  European Pat. Off. .

OTHER PUBLICATIONS

"SPI—Single Point FID Imaging MRI With Echo Times<50μs," Nauerth et al., SMRM Abstracts 1193, p. 1215; 1993.

Primary Examiner—Sandra L. O'Shea
Assistant Examiner—Michael Eisenberg
Attorney, Agent, or Firm—Hill & Simpson

[57] ABSTRACT

In a magnetic resonance tomography pulse sequence, a slice perpendicular to the spatial direction of an inhomogeneity in the static field is first excited. The nuclear spins are re-phased and spin echo signals are readout under a gradient in a second direction. A phase-encoding gradient is activated between the excitation and the readout of the nuclear spins. A predetermined inhomogeneity in the static magnetic field is permanently present and acts during the overall pulse sequence as a permanent magnetic field gradient. With this pulse sequence, an inhomogeneity in two spatial directions can be allowed, which simplifies the construction of a magnet considerably and improves the access to the subject under examination.

9 Claims, 5 Drawing Sheets 5,739,688

MAGNETIC RESONANCE IMAGING METHOD AND APPARATUS EMPLOYING A STATIC MAGNETIC FIELD HAVING A PREDETERMINED INHOMOGENEITY IN ONE SPATIAL DIRECTION

BACKGROUND OF THE INVENTION

1. Field of the Invention

The present invention is directed to a nuclear magnetic resonance tomography apparatus and to a method for operating same, in the form of a pulse sequence.

2. Description of the Prior Art

Nuclear magnetic resonance tomography is usually conducted in magnetic fields having a high degree of homogeneity, since otherwise spatial distortions of the examination subject appear in the image, given conventional pulse sequences. It is costly, however, to manufacture magnets having the homogeneity conventionally required. In particular, for Helmholtz arrangements, as are standard in particular for superconducting magnets, this can be successfully achieved only at a certain minimum magnet length. In pole shoe magnets, the relation of the pole shoe surface to the pole shoe spacing must not fall below a certain value. The required structural length, or pole shoe surface, not only means a high expenditure, but also limits accessibility to the subject disposed in the examination volume, and in tube-shaped magnets leads, moreover, to increased problems of claustrophobia. For interventional nuclear magnetic resonance tomography, good access to the patient is an essential factor.

From the point of view of cost, as well as with regard to interventional applications, imaging methods are thus desired that yield usable results even for larger magnetic field inhomogeneities. One possibility is e.g. single-point imaging methods, as specified in SMRM Abstracts 1193, page 1215. A method of this sort enables an imaging in inhomogeneous fields by replacing the readout gradient with phase-encoding steps. Only one point per scan is acquired in k-space in such a method, so that, given a quadratic raw data matrix of size N and a repetition time TR, a measurement time of N·N·TR results for one slice. For several slices the measurement time is lengthened correspondingly.

This measurement time may be unacceptably long for many applications.

SUMMARY OF THE INVENTION

An object of the invention is to provide a nuclear magnetic resonance tomography apparatus and a method for operating the apparatus in the form of a pulse sequence, in which the measurement time is significantly shortened.

The above object is achieved in accordance with the principles of the present invention in a nuclear magnetic resonance tomography apparatus having a magnet system for producing a static magnetic field with a predetermined, chronologically constant inhomogeneity in a first spatial direction, and a method for operating such a tomography apparatus, wherein a slice of an examination subject substantially perpendicular to the first spatial direction is excited with a frequency-selective radio-frequency pulse in an excitation phase, the nuclear spins in the excited slice are re-phased by means of a second radio-frequency pulse, the resulting nuclear magnetic resonance signal is readout in the form of a spin echo signal in the presence of a gradient in a second direction, a phase-encoding gradient is activated in a third direction between the excitation and the readout of the nuclear magnetic resonance signal, the excitation, re-phasing and readout are repeated n times with respectively different phase-encoding gradient values, and the nuclear magnetic resonance signals for each repetition are sampled in a readout window and entered into a row of a raw data matrix in k-space, from which an image of the excited slice of the examination subject is produced.

The method and apparatus operate on the assumption that the magnet has a predetermined chronologically constant inhomogeneity in a first spatial direction, with the inhomogeneity at least in the direction of the readout gradient being significantly smaller. In a second spatial direction, namely in the phase-encoding direction, a relatively large inhomogeneity can likewise be tolerated, since the phase-encoding depends only on the phase differences of the nuclear magnetic resonance signals between consecutive phase-encoding steps, so that the influence of a chronologically constant inhomogeneity in the phase-encoding direction is eliminated. A magnet in which an essential inhomogeneity is allowed in at least one spatial direction is considerably easier to construct than conventional magnets having high homogeneity requirements in all spatial directions. Under the aforementioned assumption, image generation is achieved with the inventive pulse sequence in a relatively short time.

DESCRIPTION OF THE PREFERRED EMBODIMENTS

Figure 1:
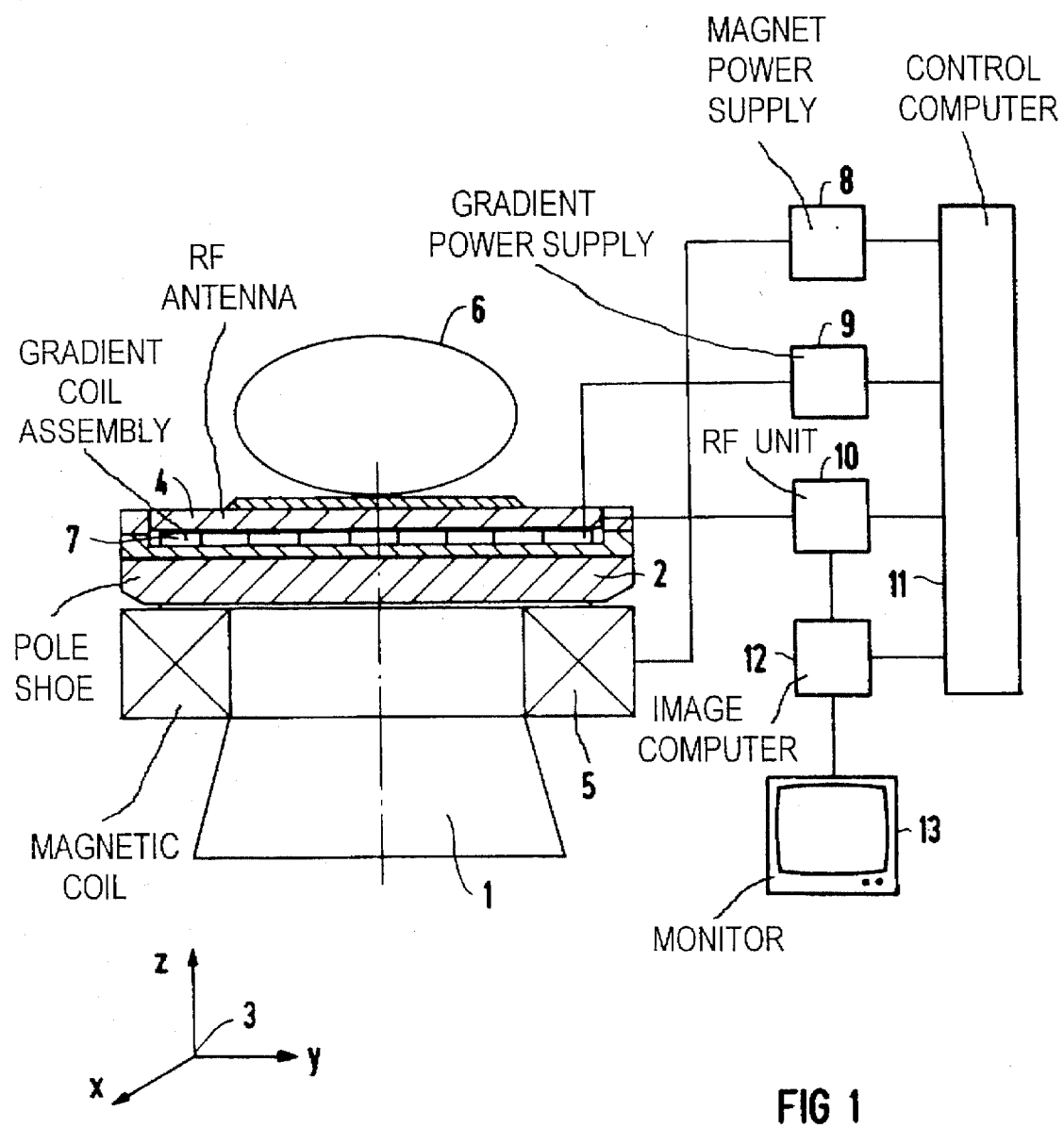
FIG. 1 illustrates an exemplary embodiment for a particularly simple magnet that meets the above requirements for use in the method and apparatus of the invention.
Figure 2:
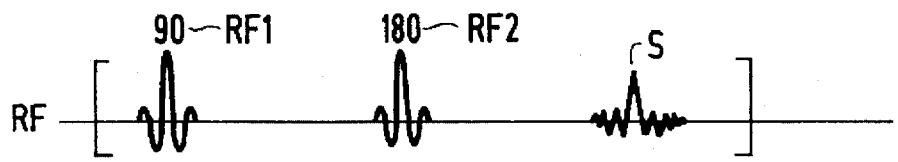
FIGS. 2 to 5 illustrate a pulse sequence as a first exemplary embodiment of the inventive method.
Figure 3:
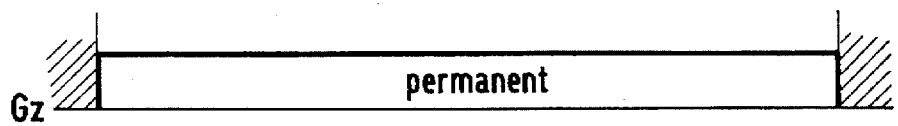
Figure 4:
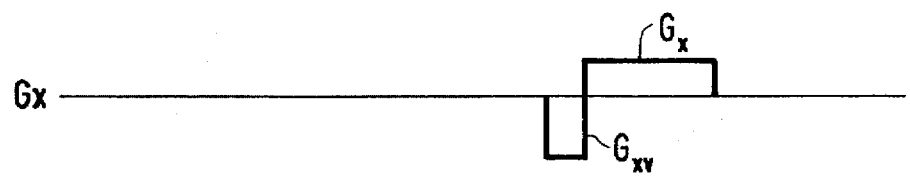
Figure 5:
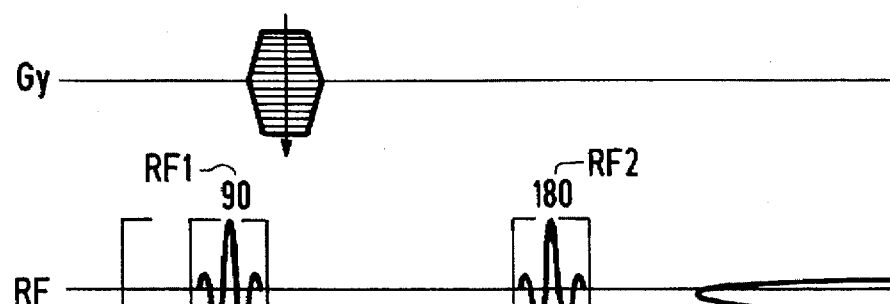
Figure 6:
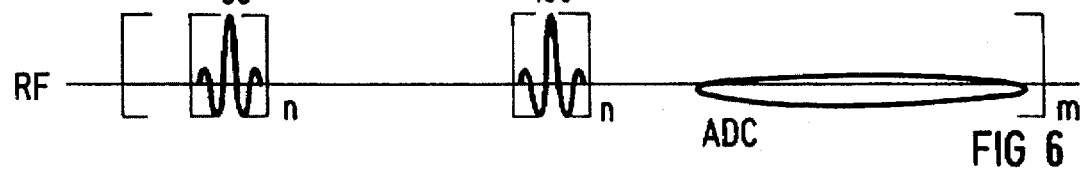
FIGS. 6 to 9 illustrates a pulse sequence as a second exemplary embodiment of the inventive method.
Figure 7:

In FIG. 1, a particularly simple magnet design is represented that meets the requirements for use in the inventive method and apparatus. The magnet system stands on a base 1 and only one pole shoe 2. The magnetic drive ensues in the exemplary embodiment according to FIG. 1 by means of a normally conductive magnetic coil 5; however, it can also be constructed as a permanent magnet. In the region of the pole shoe 2, the gradient coil assemblies 7 and the radio-frequency antenna 4 are attached. In contrast to conventional arrangements, in which three gradient coil assemblies are required for three spatial directions at right angles to one another, here only two gradient coil assemblies are needed for two spatial directions, which is further explained below. The radio-frequency antenna 4 serves in the exemplary embodiment both for transmitting (emitting) and for receiving signals. An examination subject 6 is positioned on the magnet system. The represented construction corresponds in some respects to a magnet system specified in more detail in U.S. Pat. No. 5,200,701, but with the important difference that only one pole shoe and only two gradient coil assemblies are present.

The magnetic coil 5 is fed by a magnet power supply 8 and the gradient coil assembly 7 is fed by a gradient power supply 9. The antenna 4 is connected to a radio-frequency unit 10. An image is reconstructed from the signals acquired from the radio-frequency unit by means of an image computer 12, and the image is displayed on a monitor 13. The magnet power supply 8, the gradient power supply 9, the radio-frequency unit 10 and the image computer 12 are controlled by a control computer 11.

In this construction, a relatively stronger magnetic field gradient inevitably arises in the region of the examination subject 6, perpendicular to the pole shoe 2, and thus in the z-direction, according to the Cartesian coordinate system 3 of FIG. 1. The distribution of this gradient, however, can be precisely determined. Given a corresponding design of the magnet system, a relatively good homogeneity can be achieved in the x- and y-directions, which are at right angles to the z-direction.

In FIGS. 2 to 5, as a first exemplary embodiment a pulse sequence is shown with which the nuclear magnetic resonance tomography system in FIG. 1 can be operated. According to FIG. 2, the nuclear spins are first excited by emission of a first radio-frequency pulse RF1, preferably having a flip angle of 90°. Since the $G_z$ gradient in the z-direction is permanently effective and the radio-frequency pulse RF1 is frequency-selective, nuclear spins in a slice of the examination subject 6 are thereby excited.

The nuclear spins are subsequently phase-encoded under a phase-encoding gradient $G_y$. By means of a second radio-frequency pulse RF2, preferably having a flip angle of 180°, the excited spins are re-phased, so that a spin echo S according to FIG. 2 arises. Spin echo generation is chosen because spin echoes are insensitive to inhomogeneities, in contrast to gradient echoes. The readout of the nuclear magnetic resonance signal S ensues under the effect of a gradient $G_x$ in the x-direction, preceded by a pre-phasing gradient $G_{xv}$, is prefixed in the negative direction.

This pulse sequence is distinguished from a conventional spin-warp method (such as is described, e.g., in European Application 0 511 872) essentially by the fact that the permanent inhomogeneity in the z-direction is exploited for slice selection, in place of the usual, switched slice selection gradient.

Figure 10:
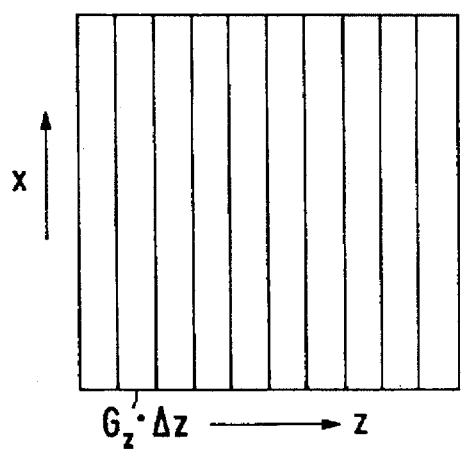
FIG. 10 shows the isolines of the magnetic field or of the resonance frequency under a gradient in the z-direction in the inventive method and apparatus
Figure 11:
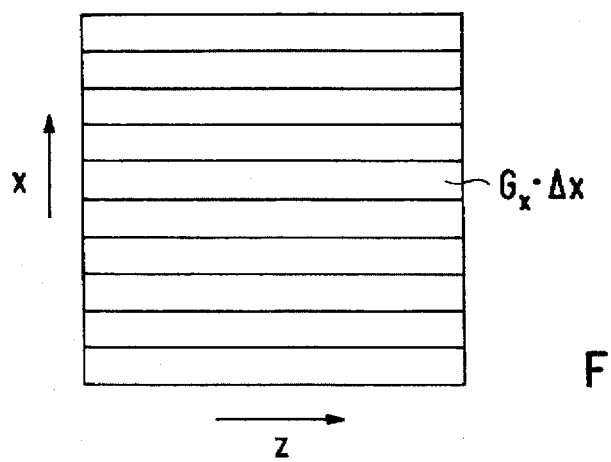
FIG. 11 shows the isolines of the magnetic field or of the resonance frequency under a gradient in the x-direction in the inventive method and apparatus.
Figure 12:
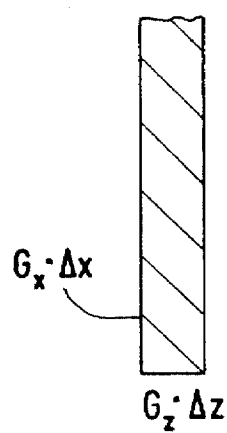
FIG. 12 shows the isolines of the magnetic field or of the resonance frequency during simultaneous activation of the x-and z-gradients in the inventive method and apparatus.

During the readout of the nuclear magnetic resonance signal S, however, not only the gradient $G_x$ but also the permanently present gradient $G_z$ acts as a readout gradient. Due to this superimposition of two gradients during readout, this technique has previously always been rejected. As is shown below, though it is true that clipped pixels are thus obtained, as is shown in FIGS. 10 to 12, this can be tolerated if certain restrictions are adhered to. FIG. 10 shows the isolines for equal magnetic field strengths, and thus equal resonance frequencies, for the conventional case in which only one gradient $G_z$ is activated in the z-direction. In FIG. 11, the corresponding isolines are shown for the exclusive application of a gradient $G_x$ in the x-direction. If now during the readout phase the gradient $G_x$ and the gradient $G_z$ are both effective, the following holds for the isolines of the gradient field:

$$G_z \cdot \Delta z = G_x \cdot \Delta x,$$

as is shown in FIG. 12. Here $\Delta z$ is the resolution in the z direction, thus the thickness of the excited slice, and $\Delta x$ is the resolution in the x-direction within a sampling.

If the condition $G_z \cdot \Delta z < G_x \cdot \Delta x$ is met, clipped pixels do result, but the position of the pixels in the x direction is however still sufficiently defined.

Figure 13:
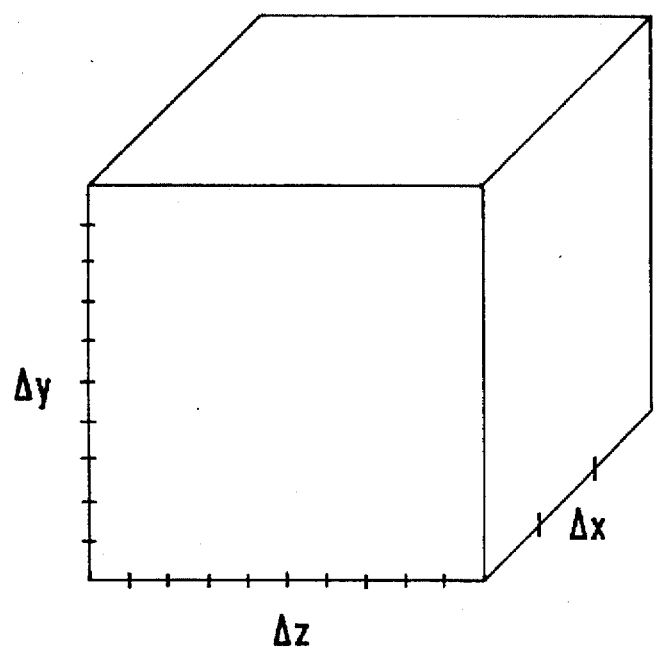
FIG. 13 shows the spatial resolution in a cuboid in the inventive method and apparatus.

If the permanent gradient $G_z$ is much stronger than the switchable gradient $G_x$ (which may in practice be the case for the represented magnet design according to FIG. 1), the following problem arises concerning the spatial resolution. If, for example, a spatial resolution of $\Delta x=1$ mm is to be achieved in a readout phase and the relation $G_z/G_x=10$ is assumed, the slice thickness $\Delta z$ will only reach a maximum of 0.1 mm if the above condition is met. This means in the first place that a very large number of slices would have to be measured to acquire a certain object volume. An even more serious problem, however, is that thin layers of this sort do not supply a sufficient signal for further processing. In order to get a usable slice thickness even given stronger gradients $G_z$, in a readout phase only a fairly rough resolution is obtained in the direction of the gradient $G_x$. In FIG. 13 this is represented for a cuboid. While a good spatial resolution can be obtained in the z-direction through the measurement of thin consecutive slices, the resolution in the x-direction remains fairly rough. In contrast, in the y-direction (thus in the direction of the phase-encoding) the resolution can be arbitrarily fine. This is because the simultaneously acting gradient $G_z$ does not cause disturbances during the phase-encoding, since the evaluation ultimately depends on the difference between two consecutive phase-encoding steps, and the constant gradient $G_z$ is thus eliminated.

The resolution in the x-direction can be increased, however, if during a measurement a complete k-space row is not sampled, but rather the sampling of a k-space row is distributed over several sequences. To explain this idea, the standard method of acquiring an image with two-dimensional Fourier transformation is first reviewed.

In general, the nuclear magnetic resonance signals acquired in nuclear magnetic resonance tomography are sampled, and the numerical values thereby obtained per nuclear magnetic resonance signal are entered into a row of a raw data matrix. The raw data matrix can be regarded as a measurement data space, or in the two-dimensional case as a measurement data plane. This measurement data space is generally designated "k-space" in nuclear magnetic resonance tomography. The information about the spatial origin of the signal contributions S necessary for image generation is coded in the phase information. The connection between the locus space (i.e. the image) and the k-space arises via a two-dimensional Fourier transformation. The following holds:

$$S(k_x,k_y)=\iint \rho(x,y)e^{i(k_x x+k_y y)}dxdy$$

Here the following definitions are valid:

$k_x(t) = \gamma \int G_x(t')dt'$ $k_y(t) = \gamma \int G_y(t')dt'$ $G_x$ = gradient in the x-direction $G_y$ = gradient in the y-direction $\rho$ = nuclear spin density $\gamma$ = gyromagnetic constant Through stepwise incrementation of the phase-encoding gradient, the sampling ensues in k-space in consecutive rows.

From the raw data matrix obtained in this way, through two-dimensional Fourier transformation an image matrix is obtained, on the basis of which an image reconstruction then ensues.

Figure 14:
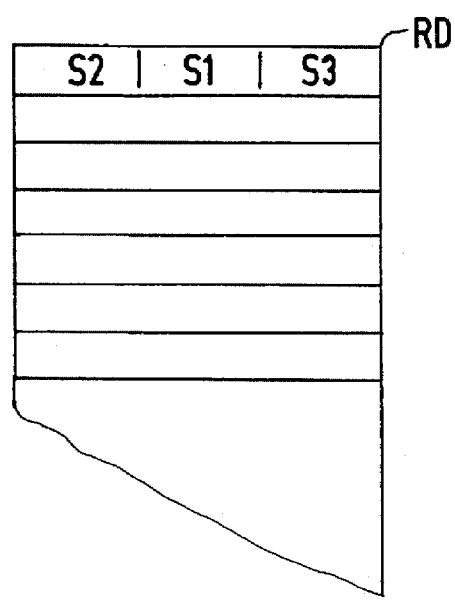
FIG. 14 shows the division of the rows of a raw data matrix in the inventive method and apparatus.

In this standard method, a complete row of the raw data matrix is sampled per nuclear magnetic resonance signal, or in other words a complete k-space row is acquired. As mentioned above, however, in the specific case concerned herein this procedure has the disadvantage that the resolution possible by this means in the direction of the readout gradient, i.e. in the x-direction, is significantly lower than the resolution in the z-direction, if the z-gradient is significantly higher than the x-gradient. This can however be avoided if in the readout of each nuclear magnetic resonance signal a complete k-space row is no longer acquired, but rather only a part of a k-space row is acquired, and thus a k-space row is not completely filled until after several measurements. In FIG. 14 it is schematically indicated for a raw data matrix RD wherein, for example, the first k-space row is divided into three sections that are respectively filled by sampling values from three different signals S1 to S3.

Figure 15:
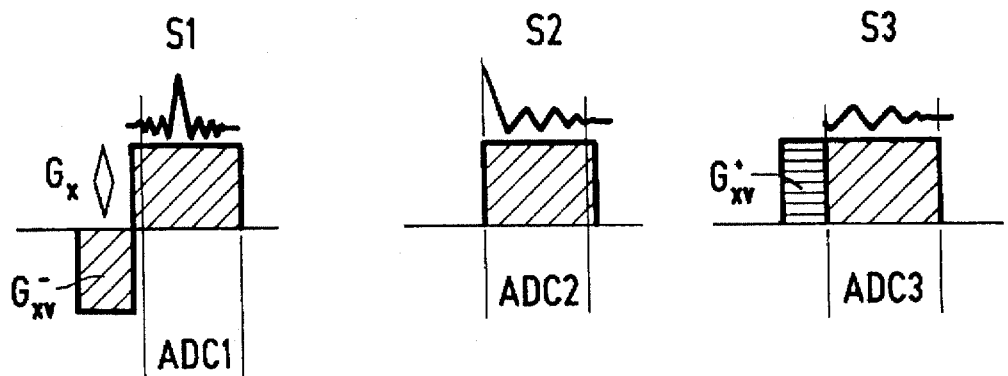
FIG. 15 shows the different pre-phasing of nuclear magnetic resonance signals in the inventive method and apparatus.
Figure 16:
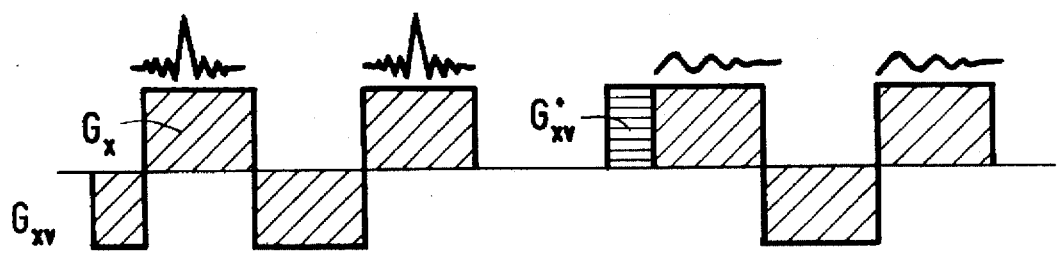
FIG. 16 shows the different pre-phasing of several nuclear magnetic resonance signals within a sequence in the inventive method and apparatus.

Due to the strong gradient in the z-direction, the nuclear magnetic resonance signal decays very quickly, so that one can usefully work only with a short sampling window. In order to obtain further k-space values, several scans are thus necessary. The nuclear magnetic resonance signals within the respective sampling windows, which are held constant, are differently positioned by means of different pre-phasings. This is schematically represented in FIG. 15. For acquiring the signal S1, a negative pre-phasing gradient $G_{xv-}$ precedes the readout gradient $G_{x1}$, as a "prefix" with the effect that the signal maximum is positioned in the middle of the readout window ADC. The average k-space values are thereby acquired.

In contrast, in the nuclear magnetic resonance signal S2 no pre-phasing gradient is required, so that the end of the signal, i.e. the high k-space values, are acquired. For the signal S3 a positive pre-phasing gradient $G_{xv}+$ is provided, so that in the readout window ADC3 the beginning of the nuclear magnetic resonance signal S3 is sampled. This corresponds to the lower k values. So that all the nuclear magnetic resonance signals S1 to S3 come to lie in the same k-space row, the phase-encoding for all three signals must of course be equal. The represented way of acquiring measurement data, with several nuclear magnetic resonance signals per k-space row, is of course connected with a corresponding lengthening of the measurement time. In a way, it represents compromises between conventional methods and the above-mentioned single-point method. Even in unfavorable cases, however, the lengthening of the measurement time remains less than that of the single-point method described above, since after each excitation at least several k-space points are obtained.

The method can be made still faster by exciting several slices one after the other in an excitation phase. A sequence of this sort is represented in FIGS. 6 to 9. In this sequence, n 90° radio-frequency pulses are applied, one shortly after the other, whose frequency spectra are graduated so that they excite spatially displaced slices under the effect of the permanent $G_z$ gradient. All the excited layers are identically phase-encoded with a gradient $G_y$ according to FIG. 9.

Figure 8:
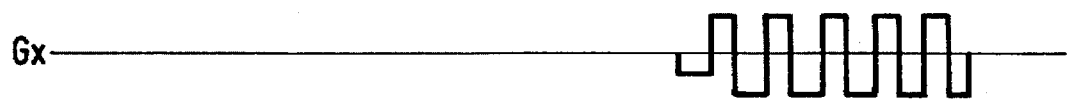
Figure 9:

By means of n refocusing pulses RF2, acting on the same slices as the n excitation pulses RF1, n spatially divided spin echoes S are generated, which are readout according to FIG. 8 under the readout gradient $G_x$ with alternating signs. The represented sequence is repeated m times, until the total raw data matrix, or in other words the total k-space, is filled. With this sequence, not only is data acquisition accelerated, but also longer echo times are achieved. This is explained in more detail below.

In the previously described sequence according to FIGS. 2 to 5, the echo time, i.e. the time between the excitation pulse RF1 and the signal S, is in general kept as short as possible, in order to achieve the fastest possible sequence execution. This results in only a weak T2 contrast being obtained, which limits the diagnostic value of the sequence for certain applications. If several slices are equally excited one shortly after the other, as is the case in the exemplary embodiment according to FIGS. 6 to 9, longer echo times $T_E$ can be realized. The number of slices excited within an echo time $T_E$ determines the length of this echo time $T_E$ and thus enables each T2 contrast to be set. The overall measurement time is not thereby lengthened, although the signal amplitude falls as the echo time $T_E$ grows.

Figure 17:
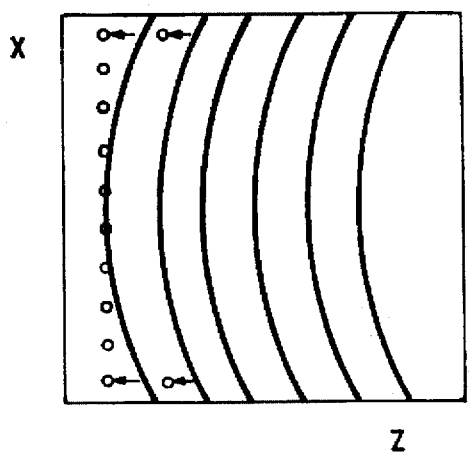
FIG. 17 shows the correction of curved layers in the inventive method and apparatus.

The signal acquisition for a k-space row can also be distributed over many sequence repetitions in the pulse sequence according to FIGS. 6 to 9. This is shown in FIG. 17. For obtaining the average k-space rows, a negative pre-phasing gradient $G_{xv-}$ is emitted before the readout gradient $G_x$. As already explained in connection with FIG. 8, the sign of the gradient $G_x$ then alternates. All signals under this gradient are centrally positioned in the associated sampling interval ADC, so that the average k-space regions are acquired. In a later sequence repetition, a positive pre-phasing gradient $G_{xv}+$ is, for example, emitted, so that the beginning of each nuclear magnetic resonance signal comes to be positioned in the sampling windows, and lower k-space values are thus acquired. It is of course possible to split the k-space rows by means of several different pre-phasing gradients.

It is a precondition for the application of the specified method that the magnetic field in the z-direction is at least monotonic; it is best for it to be linear. A non-linear curve would have the disadvantage that given equal widths of the frequency spectra of the excitation pulses, the excited slice thicknesses would not be constant. Given the distribution, presupposed as known, of the magnetic field, however, this can be compensated by a corresponding dimensioning of the frequency spectra of the radio-frequency pulses. A further problem is that it cannot be unproblematically assumed that the gradient $G_z$ caused by the inhomogeneity in the x- and y-directions, is constant. Although the three-dimensional data set in the spatial domain acquired in this way does not contain any distortions in the x,y plane, the z-layers are not planar, but are arranged on one another in the manner of the layers of an onion. This is schematically represented in FIG. 17. To compensate for these distortions, i.e., to obtain planar layers, the individual pixels must be resorted according to FIG. 17. Since the mispositioning based on the magnetic field inhomogeneity can be calculated by computer, this is possible using relatively simple computing routines.

Using the specified method, the costs for an MR apparatus can be kept low. In the exemplary embodiment, only one magnet pole and two gradient coils are required. A decisive advantage for interventional applications is the ease of access to the patient. In contrast to all known arrangements, completely free access to the patient from above and from the side is available. With the represented pulse sequence it is possible to obtain images of sufficient quality within a reasonable measurement time.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a nuclear magnetic resonance tomography apparatus comprising the steps of:

(a) generating a static magnetic field having a predetermined, chronologically constant inhomogeneity in a first spatial direction, in which an examination subject is disposed;

(b) generating a frequency-selective radio-frequency pulse in an excitation phase and thereby exciting nuclear spins in a slice of said examination subject perpendicular to said first spatial direction;

(c) re-phasing the excited nuclear spins in said slice by generating a second radio-frequency pulse;

(d) reading out resulting nuclear magnetic resonance signals in said slice in the form of spin echo signals under a gradient in a second spatial direction;

(e) generating a phase-encoding gradient in a third spatial direction between steps and (b) and (d);

(f) repeating steps (b) through (e) n times with respectively different values of said phase-encoding gradient; and (g) sampling said nuclear magnetic resonance signals in a readout window in each repetition to obtain sampled values, and entering said sampled values into a row of a raw data matrix in k-space, and generating an image of said slice of said examination subject therefrom.

2. A method as claimed in claim 1 wherein said first spatial direction comprises a vertical direction, and wherein said second and third directions define a plane perpendicular to said first spatial direction, and said method comprising the additional step of:

selecting a frequency spectrum for said radio-frequency pulse in strip (b) for, in combination with said predetermined inhomogeneity in said first spatial direction, exciting a slice of said examination subject having a thickness $\Delta z$ which is maximally equal to $(G_x/G_z)\Delta x$, wherein $G_x$ is said gradient in said second direction, $G_z$ is said inhomogeneity of said static magnetic field in said first direction, and $\Delta x$ is a spatial direction in said second direction within a readout phase.

3. A method as claimed in claim 2 wherein step (g) comprises filling rows of said raw data matrix with sampled signals obtained from respectively different repetitions.

4. A method as claimed in claim 3 comprising:

maintaining in all repetitions a constant chronological position of said readout window in relation to excitation of said nuclear spins; and acquiring different values of the nuclear magnetic resonance signals in different repetitions by displacing a position of said nuclear magnetic resonance signals in said readout window in a repetition by altering a pre-phasing of said nuclear spins in said second direction.

5. A method as claimed in claim 1 wherein step (b) comprises exciting nuclear spins in a plurality of parallel slices each being substantially perpendicular to said first spatial direction by chronologically displacing said frequency-selective radio-frequency pulse with different frequencies and thereby producing, in step (c), chronologically displaced nuclear magnetic resonance signals with alternating polarity under said gradient in said second direction.

6. A method as claimed in claim 5 wherein step (a) comprises:

generating said static magnetic field with further, non-constant inhomogeneities in respective directions perpendicular to said first direction, and comprising the additional step of, after acquiring three-dimensional data set in said raw data matrix in k-space from said plurality of parallel layers of said examination subject, compensating for a spatial distortion of the sampled values in said data set by resorting said sampled values in said raw data matrix in said first direction dependent on a known field distribution of said static magnetic field and a known interrelationship between said constant inhomogeneity in said first direction and a spatial displacement of each sampled value.

7. A nuclear magnetic resonance tomography apparatus comprising:

means for generating a static magnetic field having a predetermined, chronologically constant inhomogeneity in a first spatial direction, in which an examination subject is disposed;

means for generating a succession of frequency-selective radio-frequency pulses, each frequency-selective radio frequency pulse exciting nuclear spins in a slice of said examination subject perpendicular to said first spatial direction;

means for re-phasing the excited nuclear spins in said slice by generating a second radio-frequency pulse after each frequency-selective radio-frequency pulse;

means for reading out resulting nuclear magnetic resonance signals in each slice in the form of spin echo signals under a gradient in a second spatial direction generated after said second radio-frequency pulse;

means for generating a phase-encoding gradient in a third spatial direction between each re-phasing of the excited nuclear spins and each readout of the nuclear magnetic resonance signals, each phase-encoding gradient having respectively different values; and means for sampling said nuclear magnetic resonance signals in a readout window in each readout to obtain sampled values, and for entering said sampled values into a row of a raw data matrix in k-space, and for generating an image of said slice of said examination subject therefrom.

8. A tomography apparatus as claimed in claim 7 wherein said means for producing said static magnetic field comprises a magnet having a single pole plate.

9. A tomography apparatus as claimed in claim 8 wherein said means for reading out nuclear magnetic resonance signals includes a first gradient coil for generating said gradient in said second direction, said second direction being parallel to said pole plate, and wherein said means for generating said phase-encoding gradient comprises a second gradient coil for generating said phase-encoding gradient in said third direction, parallel to said pole plate and perpendicular to said second direction.

* * * * *